US011227777B2

(12) United States Patent
Kaeding

(10) Patent No.: US 11,227,777 B2
(45) Date of Patent: Jan. 18, 2022

(54) SACRIFICIAL SEPARATORS FOR WAFER LEVEL ENCAPSULATING

(71) Applicant: Micron Technology, Inc., Boise, ID (US)

(72) Inventor: John F. Kaeding, Boise, ID (US)

(73) Assignee: Micron Technology, Inc., Boise, ID (US)

(*) Notice: Subject to any disclaimer, the term of this patent is extended or adjusted under 35 U.S.C. 154(b) by 620 days.

(21) Appl. No.: 16/155,607

(22) Filed: Oct. 9, 2018

(65) Prior Publication Data

US 2020/0111683 A1 Apr. 9, 2020

(51) Int. Cl.
*H01L 21/78* (2006.01)
*H01L 21/56* (2006.01)
*H01L 23/31* (2006.01)

(52) U.S. Cl.
CPC .......... *H01L 21/565* (2013.01); *H01L 21/561* (2013.01); *H01L 21/78* (2013.01); *H01L 23/3178* (2013.01)

(58) Field of Classification Search
CPC ... H01L 23/3178; H01L 21/565; H01L 21/78; H01L 21/7823; H01L 21/782
See application file for complete search history.

(56) References Cited

U.S. PATENT DOCUMENTS

| 2016/0247767 | A1* | 8/2016 | Kim | .................. H01L 24/83 |
| 2017/0263837 | A1* | 9/2017 | Jeon | ................. H01L 21/67271 |
| 2018/0374717 | A1* | 12/2018 | Hsu | .................... H01L 21/6835 |

* cited by examiner

*Primary Examiner* — Hoai V Pham
(74) *Attorney, Agent, or Firm* — Perkins Coie LLP

(57) ABSTRACT

A method may include forming a set of walls on a surface of a substrate, the set of walls dividing the substrate into multiple sections, each of the multiple sections having at least one respective semiconductor device. The method may further include depositing a molding compound onto the substrate, the molding compound at least partially filling a space defined by the set of walls over each of the multiple sections and covering the respective semiconductor device of each of the multiple sections.

20 Claims, 8 Drawing Sheets

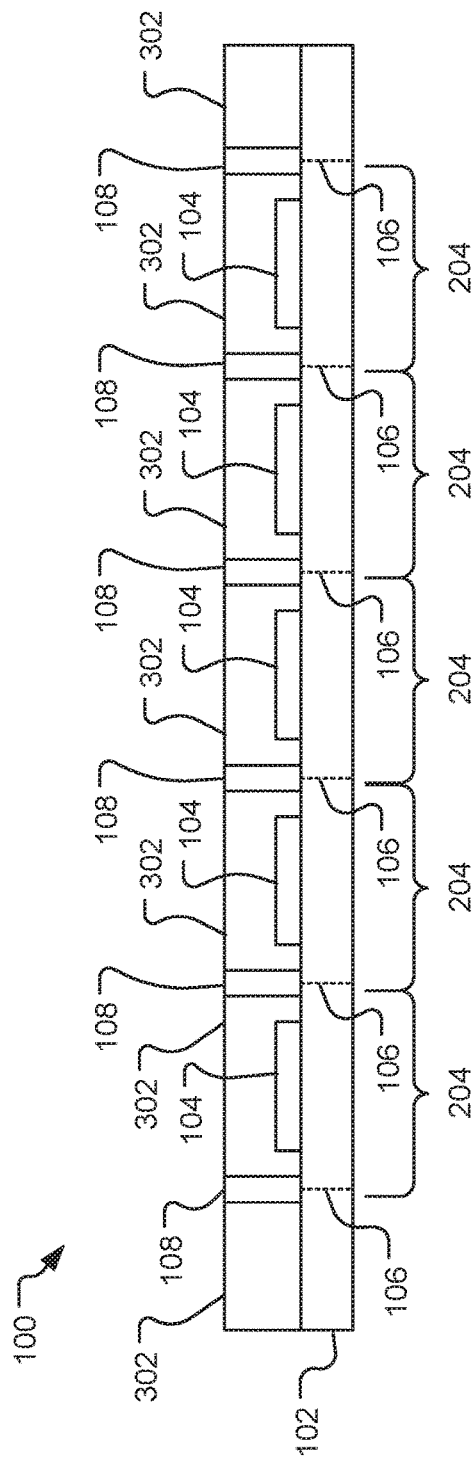
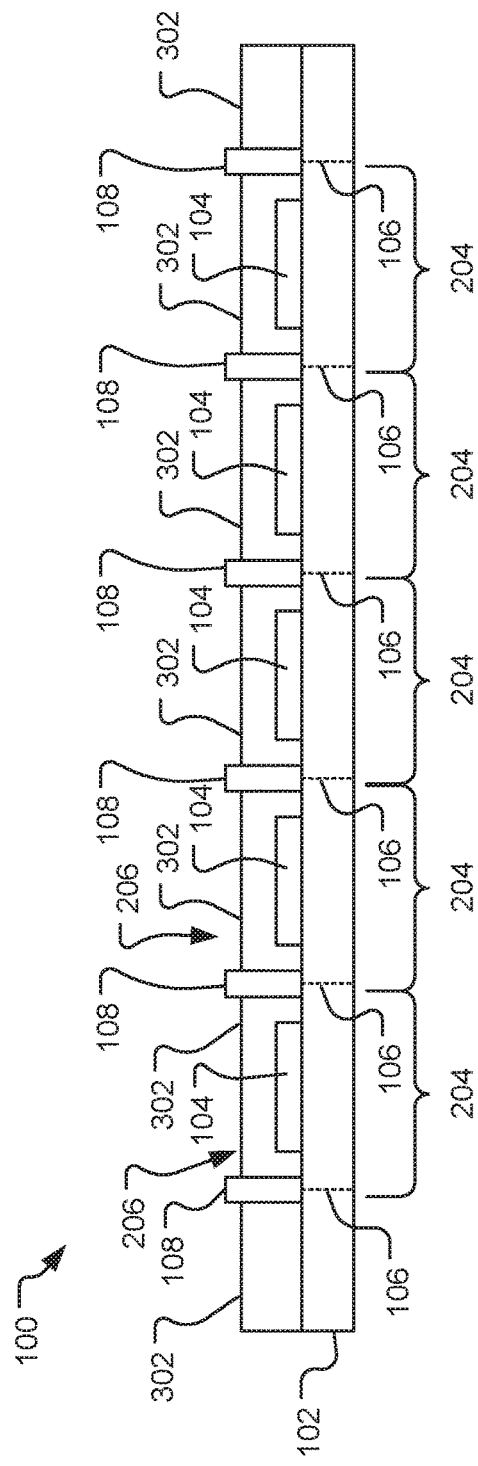
FIG. 4
FIG. 5

SACRIFICIAL SEPARATORS FOR WAFER LEVEL ENCAPSULATING

FIELD

The embodiments described herein relate to wafer level encapsulating in a semiconductor manufacturing and packaging process, and in particular, to sacrificial separators used during wafer level encapsulating.

BACKGROUND

During semiconductor manufacturing and processing, multiple individual devices may be formed on a single semiconductor wafer. This enables the simultaneous manufacturing of many semiconductor devices and promotes uniformity among each of the manufactured devices. After formation, the wafer may be separated into individual dies. In some cases, the individual dies may be packaged with other semiconductor devices. In some cases, before being separated, a molding compound may be deposited onto the wafer over the individual devices as a protection layer and/or a buffer layer.

As the molding compound cures, it may develop nonuniformities due to flow of particles suspended in the molding compound. These nonuniformities may result in differences between individual dies or packages. Further, after the curing process, a coefficient of thermal expansion (CTE) mismatch between the molding compound and the semiconductor wafer may result in significant warping. As the wafer warps, cracking or other structural instabilities may occur at the molding compound, the semiconductor wafer, and/or at other adjacent device components. Further, subsequent transportation and/or additional processing steps, may be complicated due to the warping.

BRIEF DESCRIPTION OF THE DRAWINGS

FIG. 4 is a cross section diagram depicting the embodiment of the substrate with a portion of a molding compound removed.

FIG. 5 is a cross section diagram depicting an embodiment of the substrate with a partial filling of the molding compound.

Figure 1:
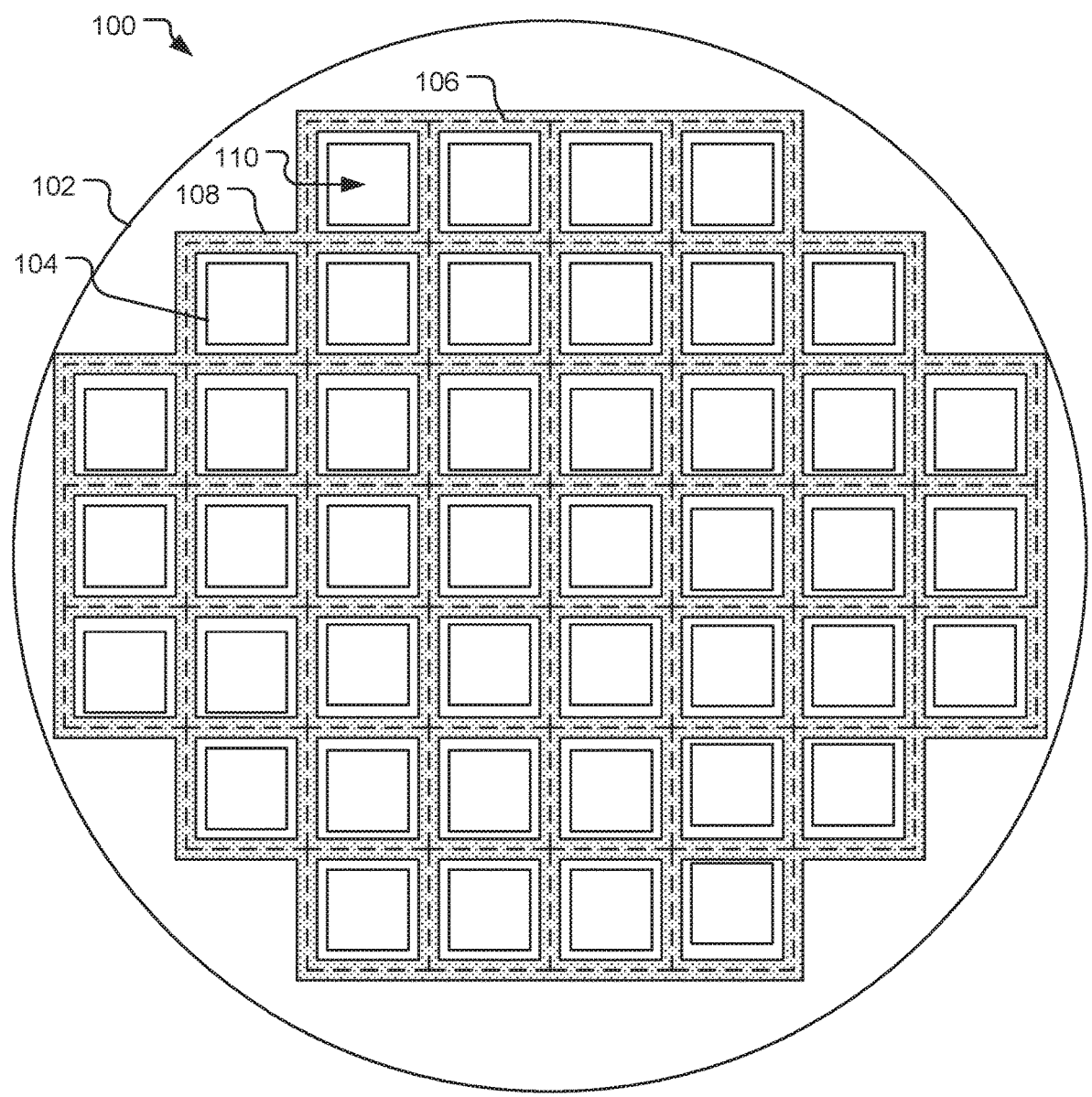
FIG. 1 is top view diagram depicting an embodiment of a substrate having sacrificial walls deposited thereon.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may further include one or more device layers deposited on a substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, and methods of making and/or operating semiconductor devices. In one embodiment of the disclosure a method may include forming a set of walls on a surface of a substrate, the set of walls dividing the substrate into multiple sections, each of the multiple sections having at least one respective semiconductor device. The method may further include depositing a molding compound onto the substrate, the molding compound at least partially filling a space defined by the set of walls over each of the multiple sections and covering the respective semiconductor device of each of the multiple sections. The method may also include removing the set of walls from the surface of the substrate after depositing the molding compound, wherein removing the set of walls forms air gaps between portions of the molding compound. Alternatively, the set of walls include a material that is more compliant than the mold compound after both the material and the mold compound are cured. The air gaps or the compliant material may reduce an amount of stress on the mold compound during subsequent processing.

Referring to FIG. 1, an embodiment of a device 100 including a substrate 102 is depicted. In some embodiments, the substrate 102 may be a semiconductor wafer (e.g., silicon wafer, etc.). In some embodiments, the substrate 102 may be a semiconductor packaging substrate. The substrate 102 may include multiple semiconductor devices 104. The semiconductor devices 104 may be formed on the substrate 102 or otherwise attached to it. The substrate 102 may be separable into multiple sections, denoted by the dotted lines 106. Each of the sections may correspond to a semiconductor die after die separation is performed. Alternatively, each of the sections may correspond to unseparated semiconductor packages. Each of the multiple sections may have at least one of the semiconductor devices 104 positioned thereon.

The substrate 102 may have a set of sacrificial walls 108 deposited thereon. The set of walls 108 may be deposited along the dotted lines 106 dividing the substrate 102 into the multiple sections. As such, the walls 108 may form a grid having cells 110. Each of the cells 110 may correspond to one of the semiconductor devices 104, which may be a semiconductor die. As described herein, the walls 108 may be used during the formation of a mold over the semiconductor devices 104. In an embodiment, the set of walls 108 may be formed using a 3-dimensional printing process.

Although FIG. 1 depicts the walls 108 as forming a grid, where each cell of the grid encompassing an individual semiconductor device 104, the walls 108 may be configured to encompass more than one of the semiconductor devices 104, such as semiconductor dies, within a cell 110. Further, although FIG. 1 depicts each die or package as being associated with one semiconductor device, in practice, multiple semiconductor devices may be associated with a single die. In practice, the substrate 102 may be divided into more or fewer dies than depicted in FIG. 1. Likewise, a size of each die or package, a size of the semiconductor devices, and a size of the walls 108, may have greater or smaller proportions than shown. In an embodiment, a width of each wall of the set of walls 108 is between 1 micron and 1 millimeter.

Figure 2:
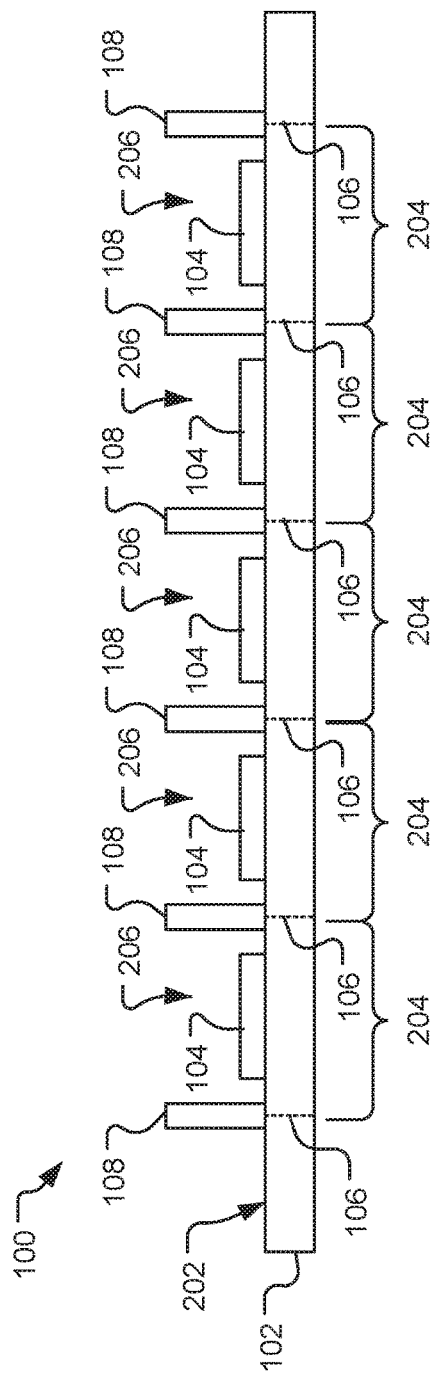
FIG. 2 is a cross section diagram depicting an embodiment of a substrate having sacrificial walls deposited thereon.

Referring to FIG. 2, a cross section diagram depicting an embodiment of a device 100 having a substrate 102 with walls 108 deposited thereon is depicted. The substrate 102 may be divided into individual dies or packages as depicted by the dotted lines 106. The walls 108 may be deposited along the dotted lines 106 on a surface 202 of the substrate 102 to form multiple sections 204. Each of the multiple sections 204 may have at least one respective semiconductor device 104 formed thereon. Although FIGS. 1 and 2 depict the multiple sections 204 as corresponding to the cells 110, in some embodiments, the walls 108 may be deposited along only some of the dotted lines 106 to include multiple cells 110 or dies within each of the multiple sections 204. As such, each of the sections 204 may include multiple semiconductor devices 104. The walls 108 may define a space 206 between the walls 108 over each of the multiple sections 204.

Figure 3:
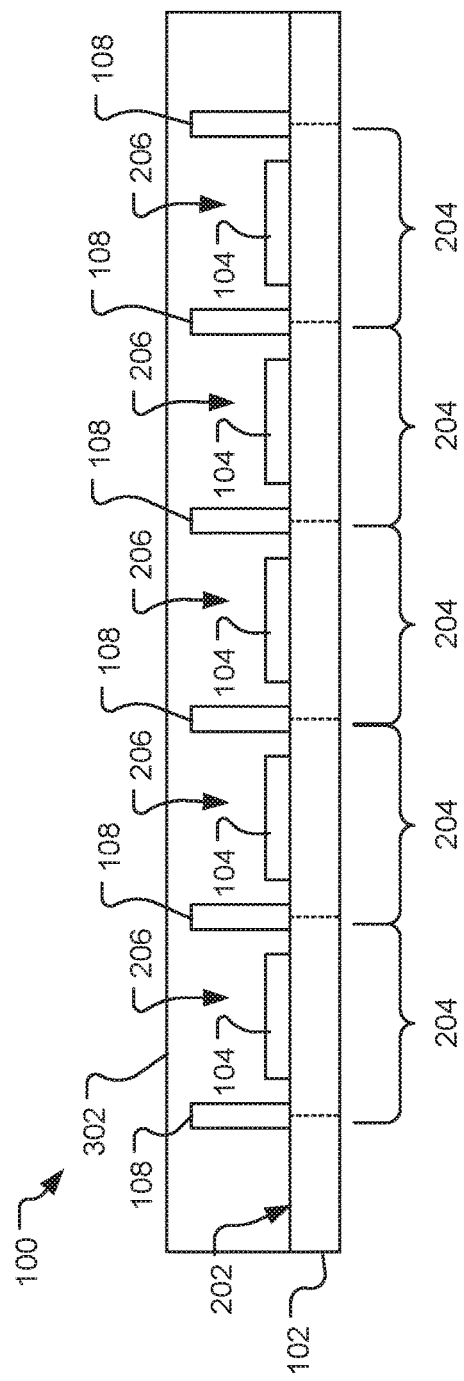
FIG. 3 is a cross section diagram depicting the embodiment of the substrate having a molding compound deposited thereon.

Referring to FIG. 3, a cross section diagram depicting the embodiment of the device 100 having a molding compound 302 deposited on the substrate 102 is depicted. The molding compound 302 may be an epoxy and may cover each of the semiconductor devices 104. Further, the molding compound 302 may at least partially fill the space 206 defined by the set of walls 108. Although FIG. 3 depicts the molding compound 302 as covering the walls 108, in some embodiments, the molding compound 302 may fill only a portion of the space 206, leaving some of each of the walls 108 exposed. Heat may be applied to the molding compound 302 in order to apply and cure the molding compound 302.

Referring to FIG. 4, in cases where the mold compound 302 covers the walls 108, a portion of the mold compound 302 may be removed (e.g., through a back-grinding process) in order to expose the walls 108.

Referring to FIG. 5, in some embodiments, the spaces 206 be only partially filled. This may enable selective application of the molding compound 302 and may allow for a more controlled deposition of the molding compound 302. Other benefits of only partially filling the spaces 206 may exist.

Figure 6:
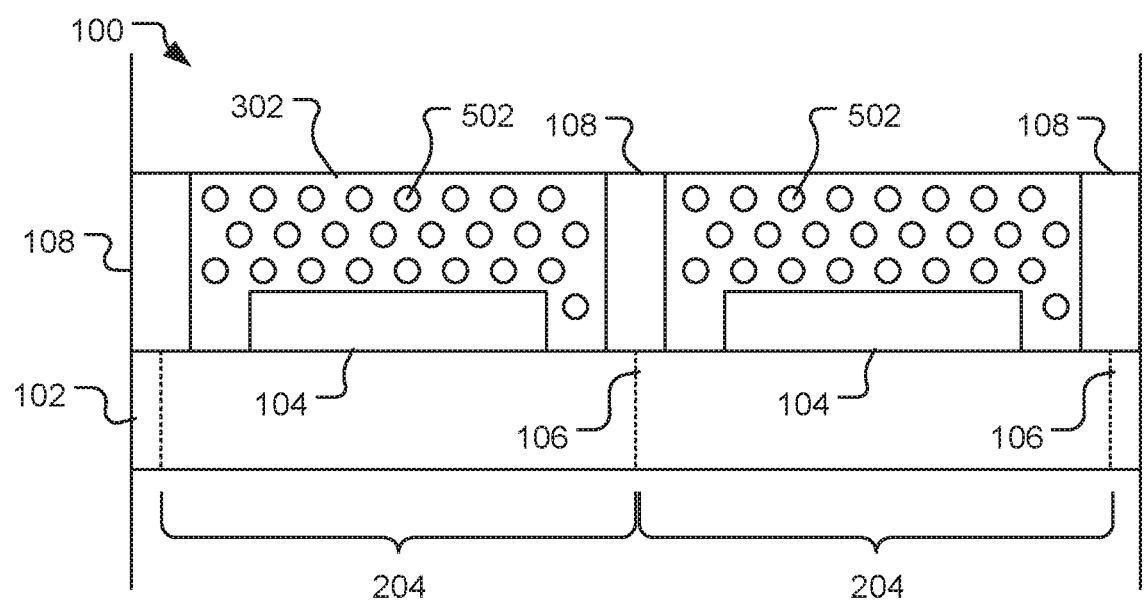
FIG. 6 is an enlarged cross section diagram depicting the embodiment of the substrate with a suspension within a molding compound.

Referring to FIG. 6, an enlarged cross section diagram depicting the device 100 with the substrate 102 and a suspension 502 within a molding compound 302. The suspension 502 may correspond to any material used within, or as part of, the mold compound 302. For example, the suspension 502 may include alumina or silica particles. Viscous material flow prior to curing a molding compound can induce particle segregation. Further, during a typical curing process a suspension in a molding compound may congregate toward one side or the other which may result in an uneven dispersal of a suspension. As depicted in FIG. 6, by including the walls 108, the suspension 502 may be prevented from moving laterally across the device 100 both before and during a curing process. As such, the walls 108 may prevent the formation of non-uniformities within the molding compound. After a curing process, a fairly uniform distribution of the suspension 502 within the molding compound 302 may result. As such, the walls 108 may prevent the formation of non-uniformities within the molding compound 302. Other benefits of including the walls 108 may exist, as described herein.

Figure 7:
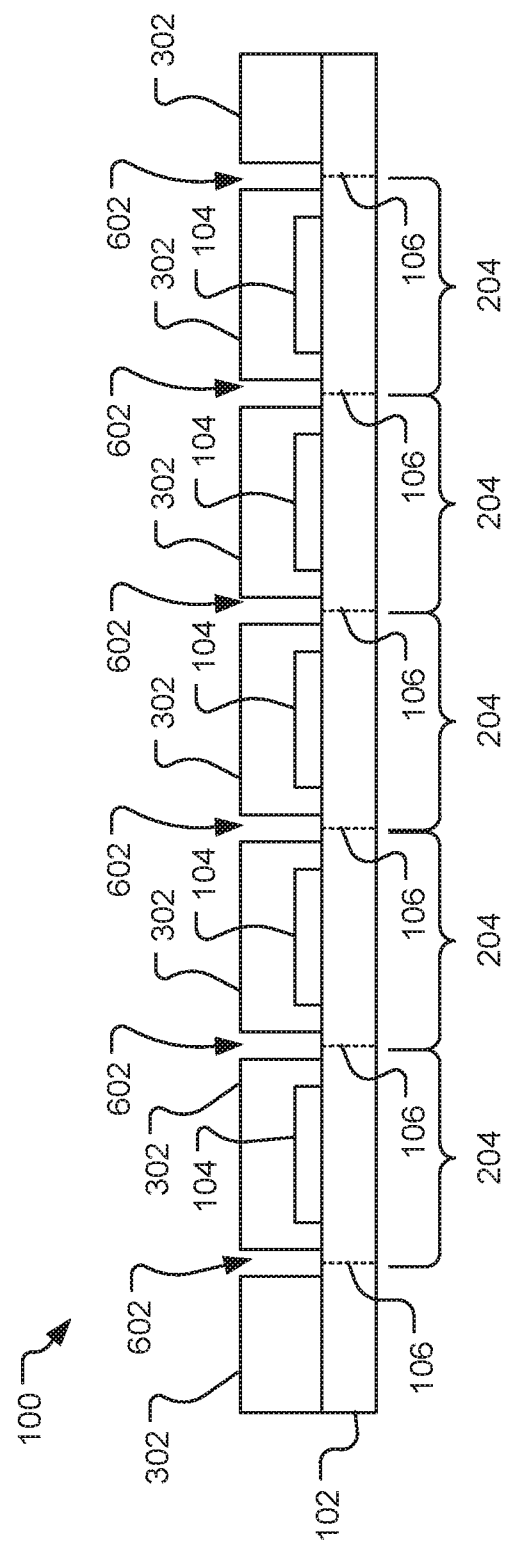
FIG. 7 is a cross section diagram depicting the embodiment of the substrate with sacrificial walls removed.

Referring to FIG. 7, after the mold compound 302 has been cured, the walls 108 may be removed to form air gaps 602 between each of the sections 204 in the molding compound 302. The walls 108 may be removed by tooling the set of walls 108, by triggering a self-depolymerizing material of the set of walls 108 to depolymerize, by dissolving the set of walls 108 in a solvent, by applying a caustic agent to the set of walls 108, by dry etching the set of walls 108, by applying heat to the set of walls 108, or the like, or by a combination thereof. For example, in an embodiment, the walls 108 may be soluble in a solvent that does not affect the molding compound 302. Other processes for selectively removing the walls 108 may be used as would be appreciated by one of ordinary skill in the art having the benefit of this disclosure.

Figure 8:
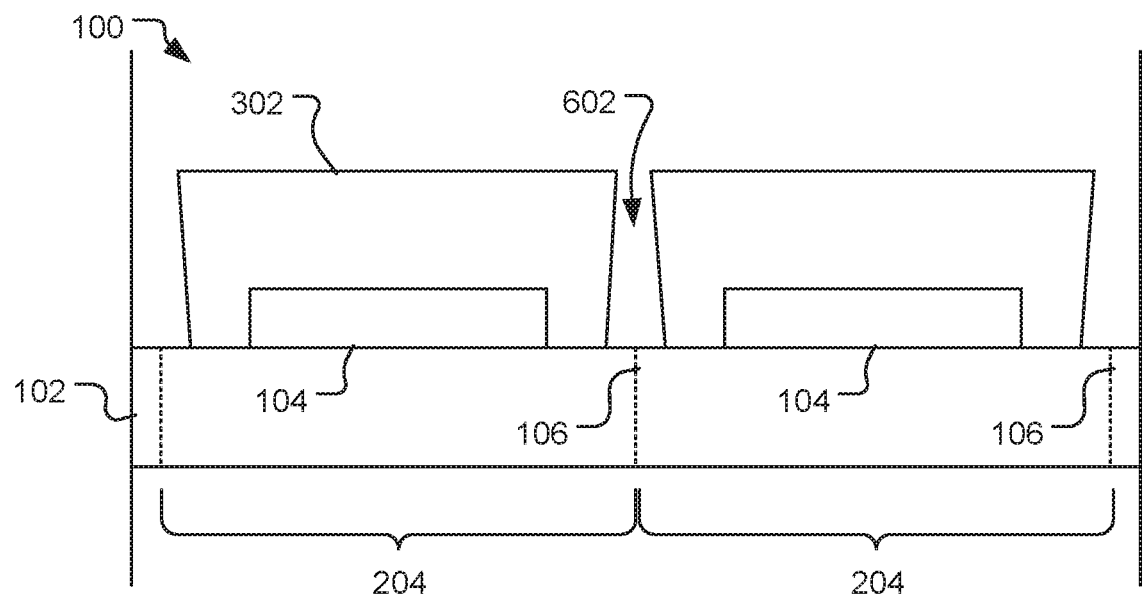
FIG. 8 is an enlarged cross section diagram depicting the embodiment of the substrate after thermal expansion has occurred.

Referring to FIG. 8, an enlarged cross section diagram depicting an embodiment of the substrate 102 after thermal expansion has occurred is depicted. Because a CTE mismatch may exist between the substrate 102 and the molding compound 302, the molding compound may expand into the air gaps 602. In other embodiments, the molding compound 302 may contract relative to the substrate 102. By including the air gaps 602, stress between the molding compound 302 and the substrate 102 may be reduced, thereby reducing or eliminating warping.

Figure 9:
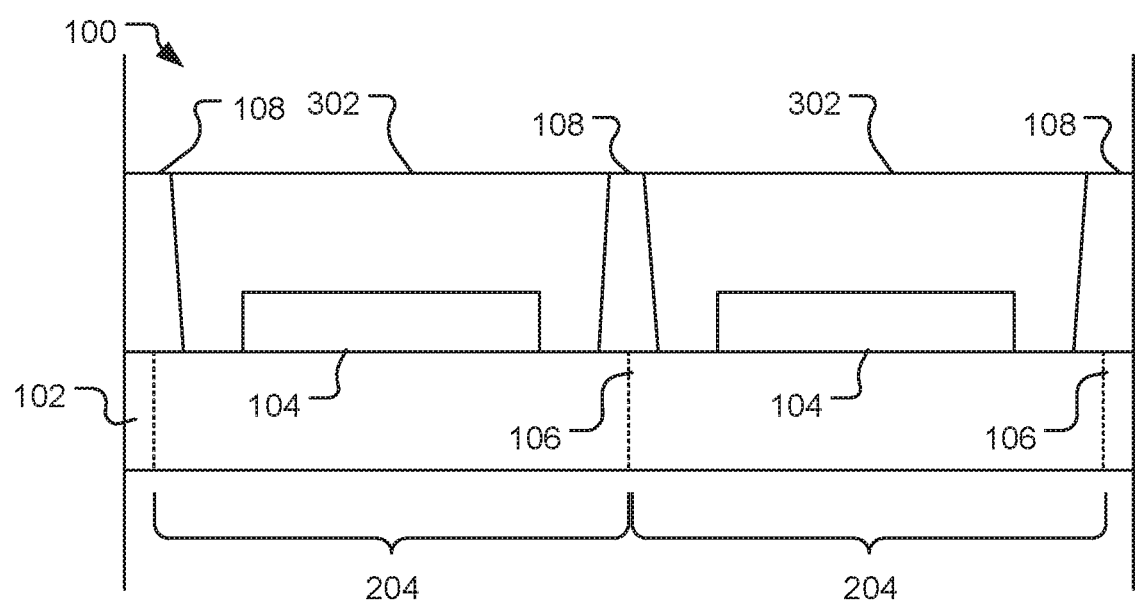
FIG. 9 is an enlarged cross section diagram depicting the embodiment of the substrate where the sacrificial walls include an expansion material after thermal expansion has occurred.

Referring to FIG. 9, in an alternative embodiment, the walls 108 may not be removed before thermal expansion occurs. Rather, the walls 108 may include an expansion material. In other words, the walls 108 may have a lower modulus of elasticity than the molding compound 302, meaning the walls 108 may be more elastic than the molding compound 302. That is, the walls 108 may include a material that is more compliant than the mold compound 302 as both the material and the mold compound 302 are cured. As the molding compound 302 expands, the walls 108 may compress and reduce stress between the molding compound 302 and the substrate 102.

By allowing for the expansion of the molding compound 302 to prevent warping, one or more additional fabrication or packaging processes may be performed without concern about the effects of a warped substrate. For example, an additional deposition or etching process may be performed, a stacking process may be performed to create a stacked package, another type of fabrication or packaging process may be performed, or combinations thereof.

Figure 10:
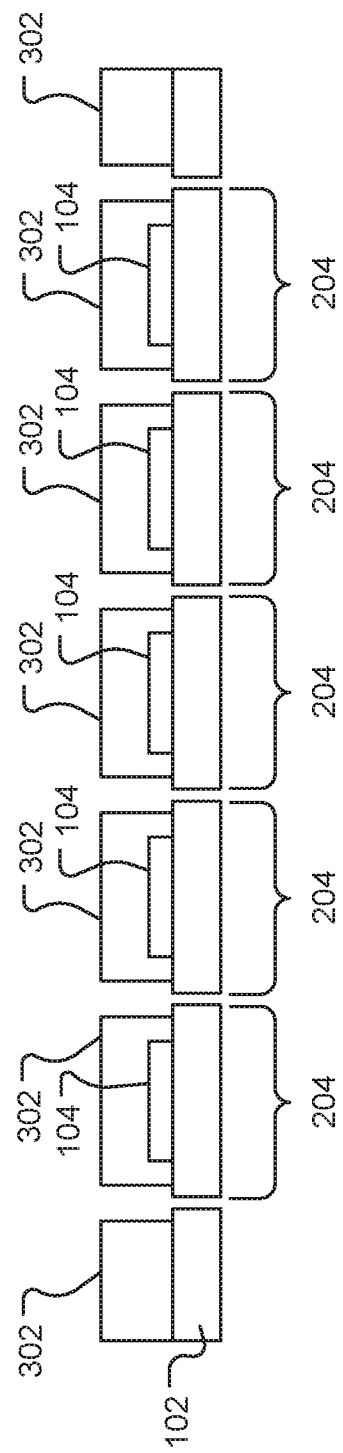
FIG. 10 is a cross section diagram depicting the embodiment of the substrate after being separated into dies.

Referring to FIG. 10, after any subsequent processes have been completed, the substrate 102 may be separated into separate semiconductor devices, such as dies, or packages. With respect to the embodiment described in FIG. 9, the walls 108 may be removed as described herein before the substrate 102 is separated as shown in FIG. 10.

Figure 11:
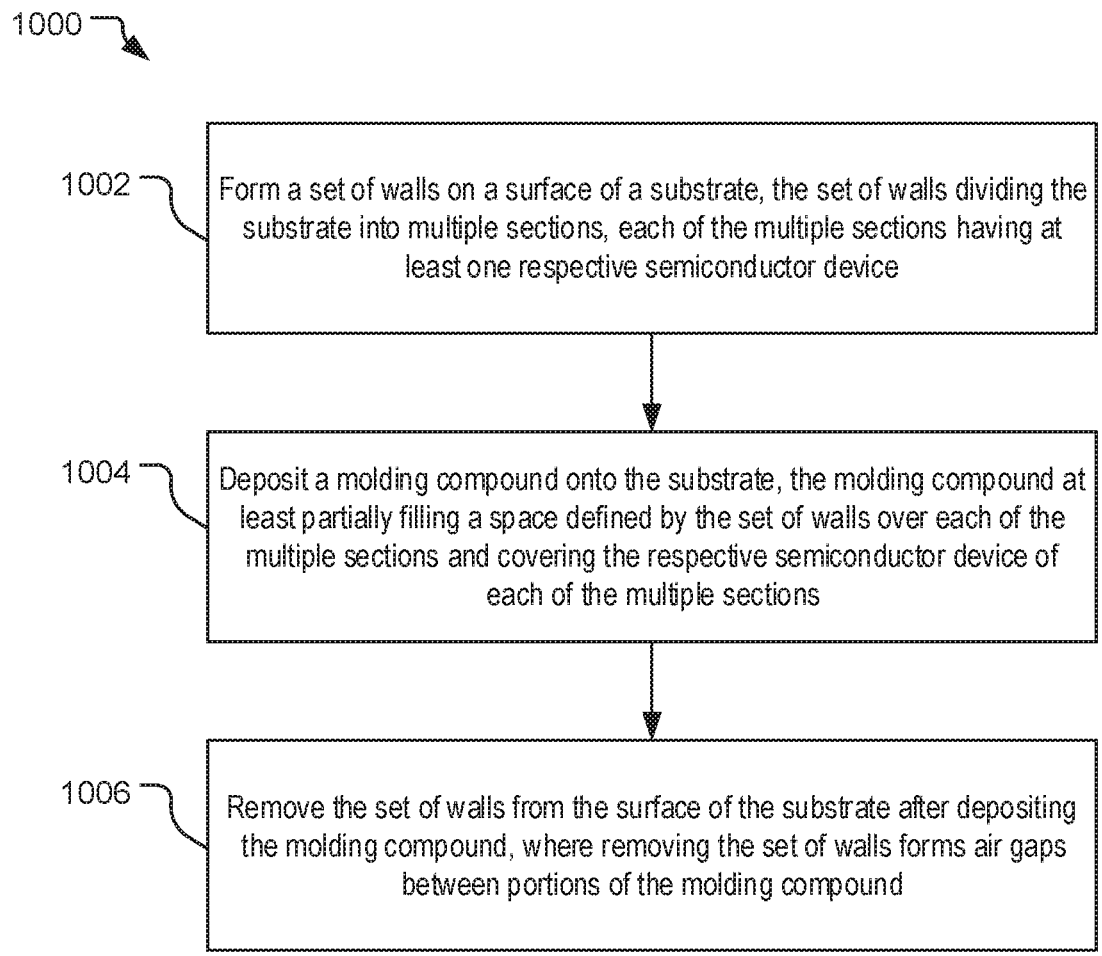
FIG. 11 is a flow diagram depicting an embodiment of a method of forming a substrate with sacrificial walls.

Referring to FIG. 11, an embodiment of a method 1000 of forming a substrate with walls is depicted. The method 1000 may include forming a set of walls on a surface of a substrate, the set of walls dividing the substrate into multiple sections, each of the multiple sections having at least one respective semiconductor device, at 1002. For example, the set of walls 108 may be formed on the substrate 102.

The method 1000 may further include depositing a molding compound onto the substrate, the molding compound at least partially filling a space defined by the set of walls over each of the multiple sections and covering the respective semiconductor device of each of the multiple sections, at 1004. For example, the space 206 may be at least partially filled by the molding compound 302.

The method 1000 may also include removing the set of walls from the surface of the substrate after depositing the molding compound, wherein removing the set of walls forms air gaps between portions of the molding compound, at 1006. For example, the air gaps 602 may be formed by removing the walls 108.

An advantage of including the walls 108 in the device 100 is that stress between the molding compound 302 and the substrate 102 may be reduced or eliminated. This may reduce or eliminate cracking or breaking of the molding compound 302 or components adjacent to the molding compound 302. As such, an output efficiency of devices from the substrate 102 may be increased.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A method comprising:
    forming a set of walls on a surface of a substrate, the set of walls dividing the substrate into multiple sections, each of the multiple sections having at least one respective semiconductor device;
    depositing a molding compound onto the substrate, the molding compound at least partially filling a space defined by the set of walls over each of the multiple sections and covering the respective semiconductor device of each of the multiple sections; and
    removing the set of walls from the surface of the substrate after depositing the molding compound, wherein removing the set of walls exposes sidewalls of the molding compound.

2. The method of claim 1, wherein the substrate is a silicon wafer, and wherein the multiple sections correspond to unseparated dies.

3. The method of claim 1, wherein the substrate is a semiconductor packaging substrate, and wherein the multiple sections correspond to unseparated semiconductor packages.

4. The method of claim 1,
    wherein removing the set of walls forms air gaps between the sidewalls of the molding compound.

5. The method of claim 1, wherein removing the set of walls comprises:
    tooling the set of walls;
    triggering a self-depolymerizing material of the set of walls to depolymerize;
    dissolving the set of walls in a solvent;
    applying a caustic agent to the set of walls;
    dry etching the set of walls;
    applying heat to the set of walls; or
    a combination thereof.

6. The method of claim 1, wherein the set of walls include a material that is more compliant than the mold compound after both the material and the mold compound are cured.

7. The method of claim 1, wherein the set of walls includes an expansion material.

8. The method of claim 1, wherein depositing the molding compound comprises covering the set of walls with the molding compound, and wherein the method further comprises back-grinding the molding compound to expose top surfaces of the set of walls.

9. The method of claim 1, wherein a width of each wall of the set of walls is between 1 micron and 1 millimeter.

10. The method of claim 1, further comprising, wherein the set of walls prevent a formation of non-uniformities within the molding compound before the molding compound is cured.

11. A device comprising:
    a substrate;
    a set of walls formed on the substrate, the set of walls dividing the substrate into multiple sections, each of the multiple sections having at least one respective semiconductor device; and
    a molding compound at least partially filling a space defined by the set of walls over each of the multiple sections and covering the respective semiconductor device of each of the multiple sections,
    wherein the set of walls is configured to be removed from the substrate to expose sidewalls of the molding compound.

12. The device of claim 11, wherein the substrate is a silicon wafer, and wherein the multiple sections correspond to unseparated dies.

13. The device of claim 11, wherein the substrate is a semiconductor packaging substrate, and wherein the multiple sections correspond to unseparated semiconductor packages.

14. The device of claim 11, wherein the set of walls is configured to be removed from the substrate to form air gaps between the sidewalls of the molding compound.

15. The device of claim 11, wherein the set of walls include a material that is more compliant than the mold compound after both the material and the mold compound are cured.

16. The device of claim 11, wherein the set of walls includes an expansion material.

17. The device of claim 11, wherein a width of each wall of the set of walls is between 1 micron and 1 millimeter.

18. A method comprising:
forming a set of walls on a surface of a semiconductor wafer, the set of walls dividing the semiconductor wafer into multiple die sections;
depositing a molding compound onto the semiconductor wafer, the molding compound at least partially filling a space defined by the set of walls over each of the multiple die sections; and
removing the set of walls from the surface of the substrate after depositing the molding compound, wherein removing the set of walls exposes sidewalls of the molding compound.

19. The method of claim 18, wherein removing the set of walls comprises:
tooling the set of walls;
triggering a self-depolymerizing material of the set of walls to depolymerize;
dissolving the set of walls in a solvent;
applying a caustic agent to the set of walls;
dry etching the set of walls;
applying heat to the set of walls; or
a combination thereof.

20. The method of claim 18, further comprising:
after removing the set of walls, performing one or more fabrication or packaging processes on the semiconductor wafer; and
separating the semiconductor wafer along air gaps between the sidewalls of the molding compound.

* * * * *